United States Patent [19]
Wagner

[11] Patent Number: 5,781,692
[45] Date of Patent: Jul. 14, 1998

[54] QUARTZ LAMP HEATER ASSEMBLY FOR THIN FILM DEPOSITION APPARATUS

[75] Inventor: Mark K. Wagner, Redondo Beach, Calif.

[73] Assignee: TRW Inc., Redondo Beach, Calif.

[21] Appl. No.: 855,545

[22] Filed: Jun. 4, 1997

[51] Int. Cl.⁶ .................. H05B 1/00; H01R 33/02
[52] U.S. Cl. .................. 392/411; 392/416; 219/537; 219/541; 439/235; 118/724
[58] Field of Search .................. 392/411, 415, 392/416, 418, 407, 408; 219/553, 411, 537, 541; 250/504 R; 362/218, 227, 249; 439/235; 118/724, 725

[56] References Cited

U.S. PATENT DOCUMENTS 3,543,002 11/1970 Poole .................. 392/432
5,367,606 11/1994 Moslehi et al. .................. 392/418
5,446,824 8/1995 Moslehi .................. 392/416

*Primary Examiner*—John A. Jeffery
*Attorney, Agent, or Firm*—Michael S. Yatsko

[57] ABSTRACT

A heater assembly for a vapor deposition apparatus is able to achieve extended operating life in the Oxygen rich low pressure high temperature atmosphere even though employing commercially available quartz lamps to generate heat. Multiple quartz lamps (1) are individually held in a socket-less support (3). The rigid lamp terminals (22 & 24) are connected to respective lengths of flexible stranded wire (30 & 28) by an INCONEL crimp insert (32 & 34), forming cables through which the lamp is connected in electrical circuit and that effectively isolate the lamp terminals from the physical effects of relative thermal expansion between heater assembly elements.

15 Claims, 6 Drawing Sheets

QUARTZ LAMP HEATER ASSEMBLY FOR THIN FILM DEPOSITION APPARATUS

FIELD OF THE INVENTION

This invention relates to radiant heater assemblies and, more particularly, to an improved multiple quartz lamp radiant heater assembly for a thin film vapor deposition apparatus used to form high temperature superconductors and epitaxial dielectrics.

BACKGROUND

One process for producing superconductive materials vaporizes a source material, the target, in a controlled high temperature oxygen rich low pressure environment, between 200 milli Torrs and 600 Torrs, to form a plasma. The plasma is allowed to deposit on a substrate to form a layer or film of the superconductor material. With continued deposition, the film on the substrate grows in thickness. During the process the growing film is maintained at a high temperature of between 650 to 900 degrees Centigrade.

One apparatus for that process employs a metal vacuum chamber, housing a target holder, a substrate and a heater adjacent to the substrate. The source material is placed in the holder and the chamber is evacuated to a high vacuum, initially, followed by the introduction of a prescribed amount of oxygen. A high power laser beam is passed through a chamber window to vaporize the target source material and form a plasma. The foregoing is referred to as a laser ablative procedure. Electric current is supplied to the heater. In turn the heater generates radiant energy to heat the substrate during deposition, maintaining the deposited film at a steady high temperature. The foregoing process is used to produce films of Yittrium Barium Copper Oxide, a superconducting material. The foregoing description is necessarily brief, it being understood that the full details of the foregoing known film deposition process are not necessary to an understanding of the present invention.

The heater assembly is recognized as critical to the foregoing process. It must maintain the substrate and deposited film at an essentially constant high temperature as the film grows to the desired thickness. The radiant energy raises and maintains the temperature of the deposited film to a very high temperature, appropriately on the order of 680 degrees Centigrade. Thus not only must the heater generate and withstand those very high temperatures, but it must do so, firstly, in a high vacuum region for a short period, and, secondly, in a low pressure oxidizing atmosphere during the period in which the deposition process continues. To minimize replacement and/or repair, the heater must withstand those temperatures and atmospheres repeatedly, since the deposition apparatus is used over and over again, to fabricate different pieces of such film material.

The cost of producing superconducting material is at least in part related to the cost of the process equipment and plant required for its manufacture. One naturally wishes to fabricate the equipment's component elements, particularly the heater assembly, as inexpensively as possible, while ensuring that the heater elements are reliable and have a reasonably lengthy service life.

One means of producing the requisite temperatures recognized by the present inventor, is with a number of commonly available standard inexpensive quartz lamps. The quartz lamp contains a tungsten filament in a metal halide gas atmosphere confined within a quartz glass envelope. Electrical leads or pins extend through the envelope for making electrical connections. The lamp's rigid pin contacts are designed for insertion into a lamp socket that connects the pin contacts in circuit with the electrical current supply. The lamp's tungsten filament converts the electrical current conducted through the filament into visible light and radiant energy or, as variously termed, heat.

Quartz lamps are produced and sold in volume for the industrial and consumer markets. They appear in entertainment lighting, photographic lighting equipment, projectors and other industrial equipment. One such lamp is marketed by the Ushio company and others. Being produced in high volume in a competitive market, the purchase price of such quartz lamps is quite low, making it financially attractive as a light and/or heat source. Incorporating such lamps within a heater assembly for the foregoing laser ablative thin film deposition apparatus becomes an attractive goal.

Given that goal, one quickly finds that commercially available quartz lamps are designed for use with lamp sockets, also marketed commercially. Those lamp sockets are designed for use in a normal atmosphere, where convective cooling removes heat from the lamp pin to socket junctions, not for an essentially one-hundred per cent Oxygen atmosphere or in vacuum. Oxygen rapidly oxidizes the lamp socket's metal contacts, creating a high resistance connection and, in operation, consequent build up of $I^2R$ joule losses, heat, at that location. Micro-arcing from the junctions can also occur. That heat and/or arcing quickly destroys the electrical connection, rendering the lamp and heater assembly inoperative.

Although it is theoretically possible to design and develop quartz lamps and associated sockets that would withstand the rigors of the described vapor deposition environment, it is also recognized that the development and production of a new lamp and socket design for what is essentially a very low volume market is economically impractical. The cost per lamp and socket produced would be exceedingly high and might thereby render the entire development impractical.

To avoid use of such commercial lamp sockets in the heater assembly, a cooled cylindrical shaped lamp housing was used to mount a group of quartz lamps in cylindrical passages in a circular array with the lamp's electrical leads or pins exposed at the back side of the housing. An approach earlier taken by others was to incorporate in that lamp housing a pair of electrically conductive metal plates, locating one plate on each side of a lamp terminal pin, and sandwiching the pin between those metal plates. The plates were formed of a Cobalt alloy, known as Haynes 214, a metal conductor capable of withstanding the corrosive effects of an Oxygen rich atmosphere. The clamping plates were screwed to a stand-off that in turn was mounted by a tubular insulator to the cylindrical rim surrounding the backside of the lamp housing.

Further, each pair of such clamping plates bridged between a contact pin of an adjacent lamp, placing the two lamp's contact pins in electrical circuit. With a series of such plate pairs, the entire group of lamps in the heater were placed in electrical series circuit, which minimized the number of external electrical connections required to the heater assembly, but which had significant disadvantage. In practice the quartz lamps inexplicably failed after only two hours of operation.

The present inventor recognized that the foregoing contact structure contributed to the failure and the thermal mechanism which caused that failure, which the present invention avoids. With approximately 32 volts DC required for each lamp in the series string at maximum power, the total voltage required across the string is about 250 volts DC. At the low pressures in the vapor deposition chamber a low impedance plasma can be generated by a potential of only 70 volts DC. Such a low impedance plasma extracts current and power, which is wasted. And sputtering can occur. Further, in operation of the film deposition apparatus, the heater assembly undergoes a thermal cycling. That is, from room temperature to about 680 degrees Centigrade, reversing when the apparatus is turned off. The metal strips clamping the lamp's terminal pins are mechanically connected to the heater's outer cylindrical shell. When heating occurs, the thermal expansion of the metals has the net effect of producing a significant lateral force on the lamp's rigid terminal pin. The strain created thereby is physically reflected in some way through the quartz lamp envelope to the lamp's internal elements located within the quartz envelope.

The lamp's Tungsten heater or filament is of the geometry of a helix and is supported between two equal length straight sections. Tungsten is a very brittle and fragile material, unsuited for extension through the lamp's quartz envelope. The lamp manufacturer thus connects, internal of the quartz envelope, a length of a different conductor material, suitably Molybdenum, a relatively stiff material, to the end of each straight length of the Tungsten heater coil. Those attached conductors extend through the quartz envelope and form the lamp's terminal pins. Lateral stresses externally produced on the latter pins apparently created sufficient force within the quartz envelope to break the fragile Tungsten and, hence, the electrical connection to the lamp filament, causing the disfunction.

The Tungsten filament's fragile nature is of no concern to the lamp manufacturer. The latter provides electrical sockets for the industrial applications in which the lamp manufacturer intends its lamps be employed, and not as part of a heater assembly for a film deposition apparatus. Those lamp sockets do not produce lateral force on the terminal pins in the known industrial applications.

An object of the present invention is to provide a vapor deposition equipment heater assembly with socket-less circuit connections for a standard quartz lamp that insulates the lamp from thermal shock.

Another object of the invention is to provide an electrical connection to the electrical terminals of a quartz lamp of a film deposition apparatus heater assembly that minimizes application of thermally produced lateral forces to the lamp's terminal pins.

Still another object is to adapt commercially available quartz lamps, intended for street lighting and like commercial applications to application within a heater assembly in a high temperature thin film vapor deposition apparatus;

And a still further object of the invention is to provide a vapor deposition apparatus heater assembly that incorporates standard quartz lamps and withstands repeated temperature cycling between 600 and 800 degrees Centigrade and room temperature.

SUMMARY

In accordance with the foregoing, a novel heater structure for use in a high temperature oxygen rich low pressure atmosphere incorporates commercially available quartz heat lamps to maintain a deposited film at temperatures of between 600 and 900 degrees Centigrade. The lamps are supported in a socket-less cooled housing that in turn is supported in cantilever like fashion at the end of a hollow metal shaft. To connect the lamps in parallel electrical circuit, a hollow metal cylinder is supported in insulated relationship with and coaxially on that hollow metal shaft and serves as one electrical contact block. Another short hollow metal cylinder, supported on the lamp housing, is oriented coaxial of and at the end of the hollow metal shaft and serves as a second electrical contact block. The rigid elongated electrical contacts of each lamp are joined with a oxidation resistant crimp insert, suitably formed of INCONEL, to a respective flexible stranded wire, there being two such wires for each lamp. One of the wires of each lamp is fastened to the first electrical contact block and the other wire is fastened to the other electrical contact block, thereby placing the lamps in parallel circuit between the two contact blocks. By connecting the first contact block to a DC supply output and the metal shaft to ground, electrical current is supplied to the lamps.

In repeated cycling of the vapor deposition apparatus, thermal expansion and contraction between the metal parts is found to be isolated from the rigid terminals of the lamp as the wire easily yields and does not transmit significant force on the rigid lamp terminals. This limits transmittal of mechanical forces through the rigid lamp terminals to the lamp's Tungsten filament, which, in the past is found to result in premature destruction of the lamp's filament.

The foregoing and additional objects and advantages of the invention together with the structure characteristic thereof, which was only briefly summarized in the foregoing passages, becomes more apparent to those skilled in the art upon reading the detailed description of a preferred embodiment, which follows in this specification, taken together with the illustration thereof presented in the accompanying drawings.

DETAILED DESCRIPTION OF THE PREFERRED EMBODIMENT

Figure 1:
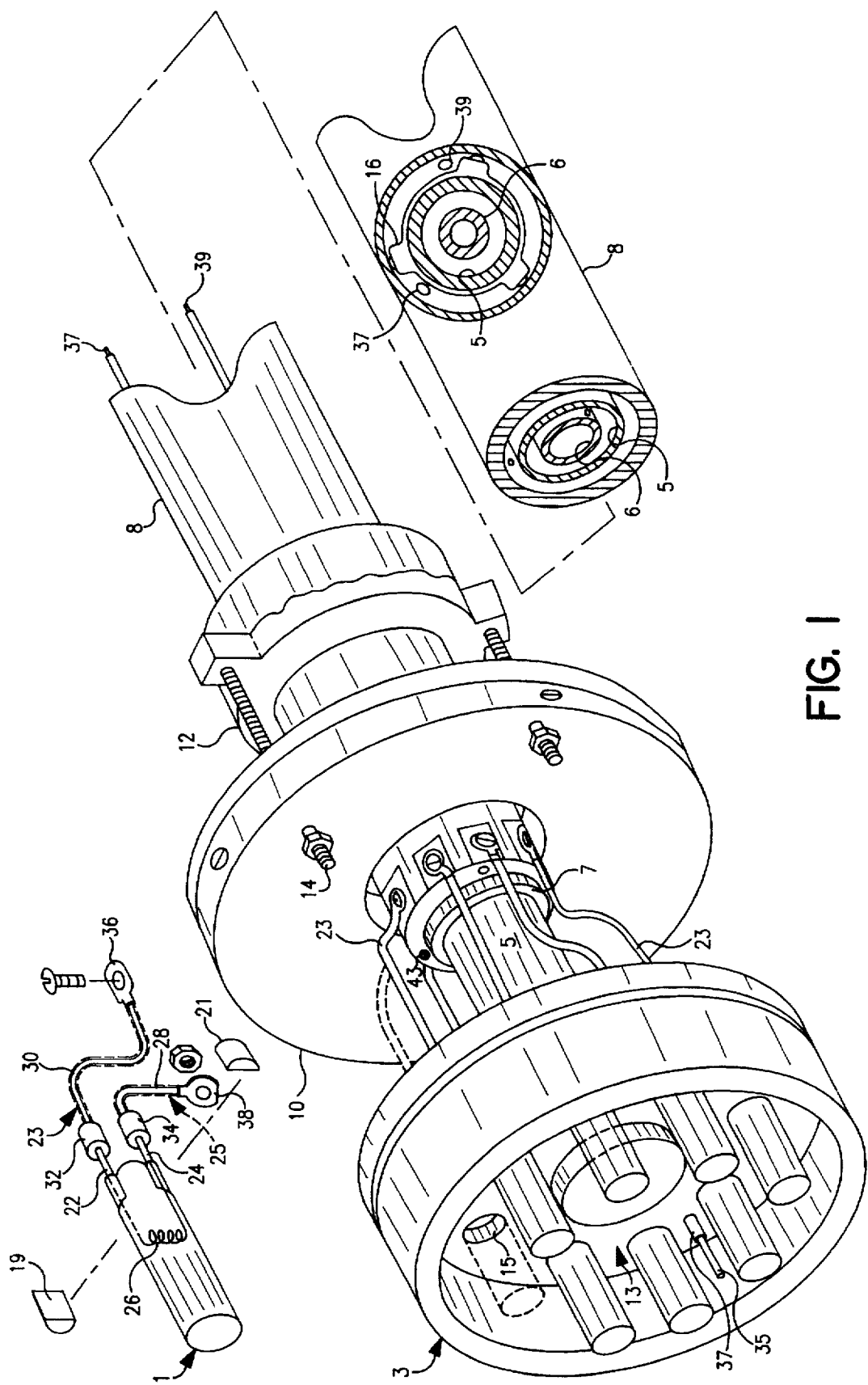
FIG. 1 illustrates an embodiment of the heater assembly in a front isometric view.
Figure 2:
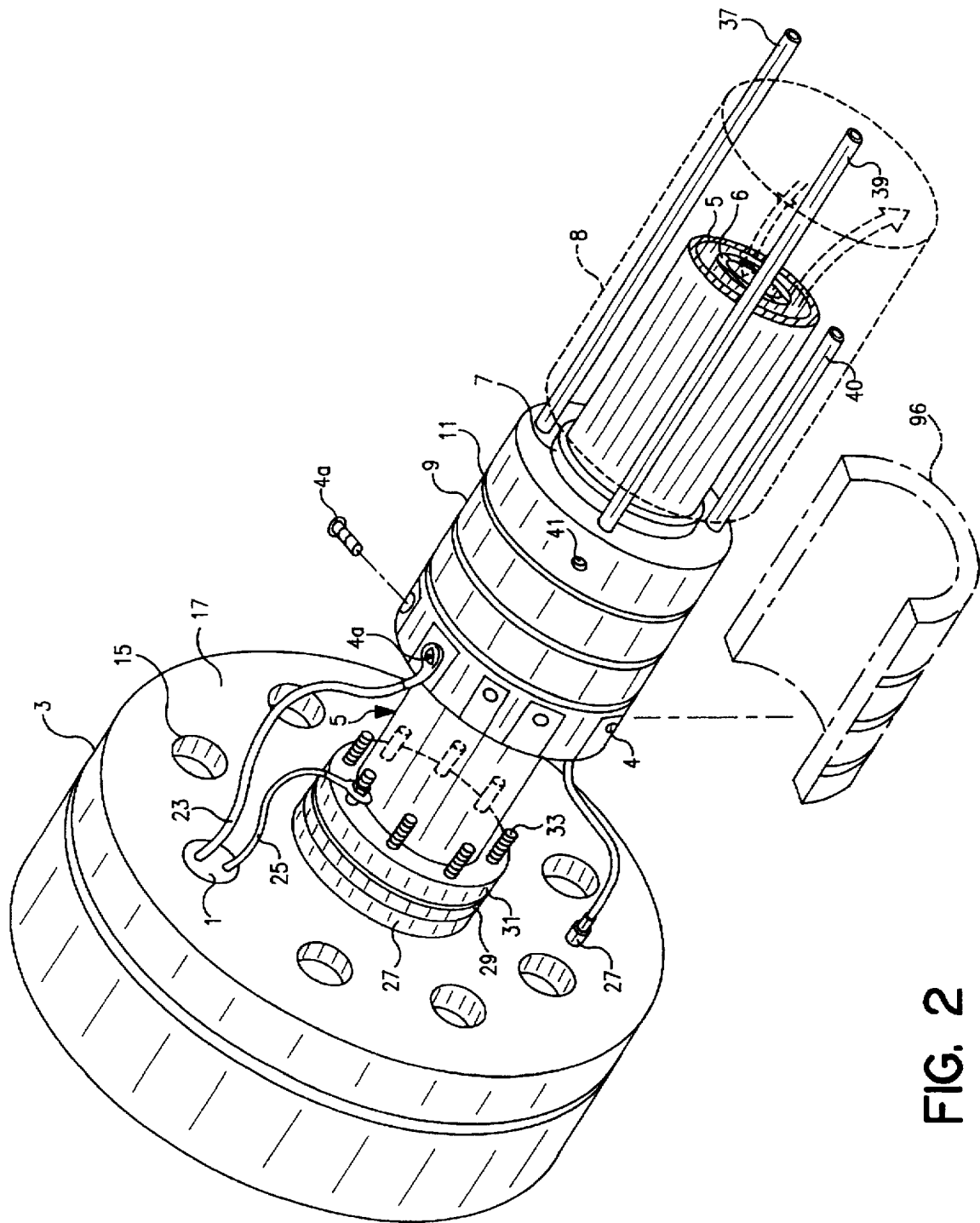
FIG. 2 is a rear view of a portion of the heater assembly of FIG. 1.
Figure 3:
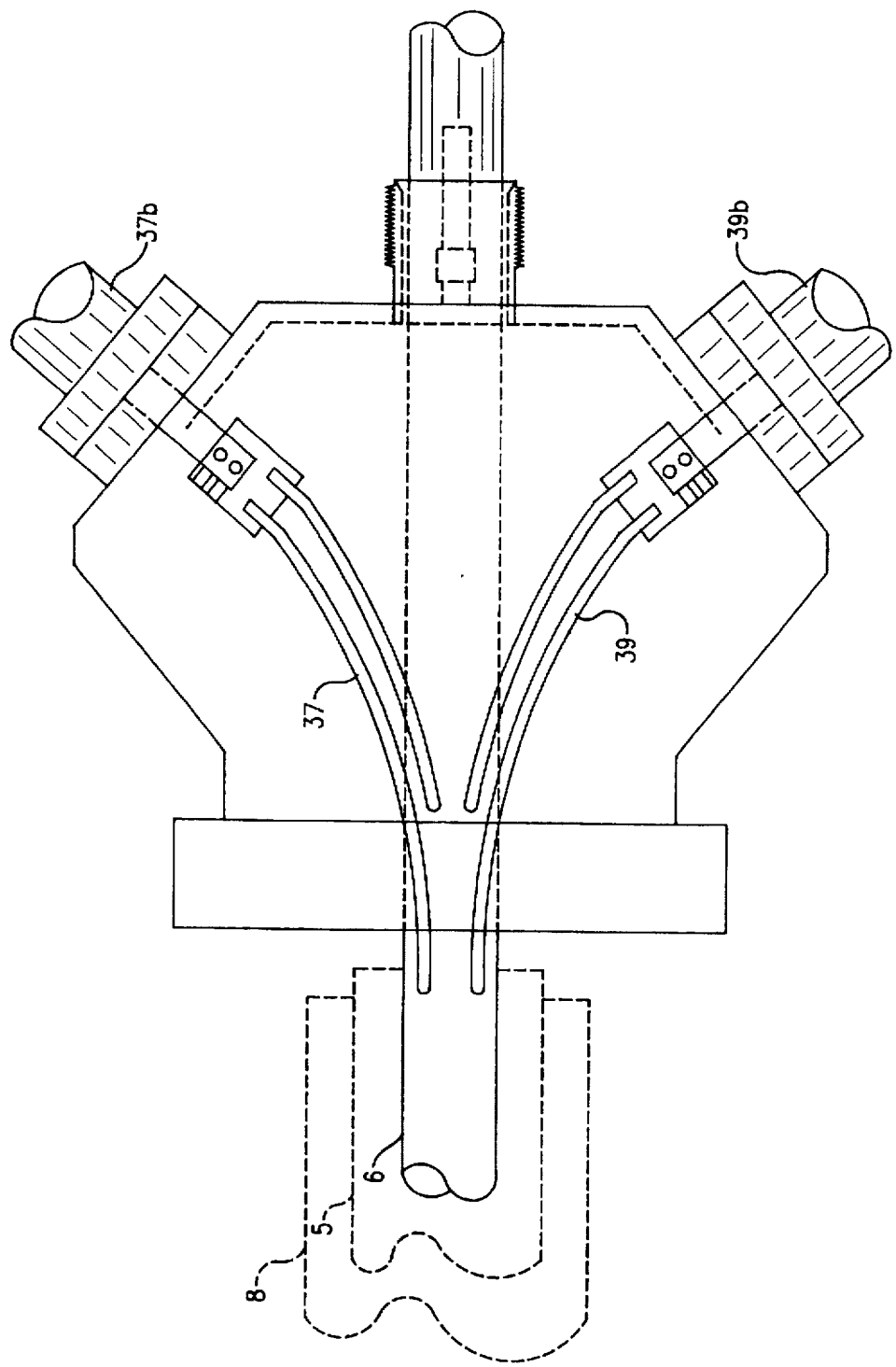
FIG. 3 is a not-to-scale top plan view of the rear portion of the heater assembly of FIGS. 1 and 2.

Reference is made to FIG. 1, which illustrates the novel heater assembly in partially exploded isometric view as viewed from the front and to FIG. 2 illustrating that assembly as viewed from the rear with some elements omitted. The remote end of the assembly is illustrated in FIG. 3. As illustrated in FIG. 1, the heater assembly includes a plurality of eight quartz lamps 1, such as the thirty two volt 400 watt model commercially available from Ushio company. Those lamps are supported in a cylindrical shaped metal lamp support or housing 3. Collectively, during operation, the lamps generate radiant heat sufficient to produce the requisite high temperature within the confined oxygen rich low pressure region of the vapor deposition apparatus in which the heater assembly is employed. As is apparent, in other embodiments greater or lesser numbers of lamps may be used. Lamp housing 3, in turn, is supported at the end of a hollow metal shaft or tube 5.

Lamp housing 3 is of a generally cylindrical outer geometry. It contains a hollow interior to receive and exit coolant fluid, as later herein described more fully in connection with FIG. 4, and is formed by welding separate appropriately shaped metal pieces together into the geometry illustrated. To enhance its heat radiating characteristic, the metal lamp housing 3 is plated with a layer of heat radiating material, such as Gold, that forms a mirror like finish. The lamp housing contains a generally circular face 13 that is recessed from the housings front circular edge and contains a small central circular protrusion. A curved internal wall portion slopes inwardly from the circular front edge to the periphery of the circular face to assist in redirecting any laterally directed radiant energy from the lamps in the forward axial direction.

To support the lamps, eight axially extending small short cylindrical passages 15 are provided, which open into face 13 and, as viewed in FIG. 2, extend through the lamp housing's circular shaped back wall 17. The passages are conveniently formed by welding short hollow metal cylinders into place in circular openings in the front and rear walls, 13 and 17. The passages are symmetrically arranged in a circle of a predetermined radius centered at the center of the cylindrical lamp housing and are also spaced from the lamp housing's outer rim.

Each lamp 1 is supported within a respective cylindrical passage 15. Although the body of a quartz lamp is generally cylindrical in shape as illustrated in the exploded view of the lamp in FIG. 1, the bottom portion, where the lamp's extending electrical pins or leads are located, is somewhat more flat or rectangular in shape. To better hold the lamp in place within the cylindrical passage at the flattened lamp base portion, two semi-cylindrical metal inserts 19 and 21, shown in the exploded view of one lamp, are provided. One insert is placed on each side of the lamp's bottom portion, and together those elements form a relatively cylindrical shape that better fits within the lamp passage and holds the lamp in place. For each such lamp sub-assembly, the associated insulated electrical leads attached to the lamp, later herein discussed, are first inserted first through the small passage. Then the lower body portion and the two inserts is inserted and pressed into place.

Referring to the rear view of FIG. 2, the rear of the lamp housing includes a short hollow cylindrical metal collar 27, welded on one side to wall 17, a metal O-ring gasket 29 and an annular or short cylindrical shaped metal ring 31 which are stacked coaxially on rear wall 17 and fastened in place.

Metal ring 31 contains eight rearwardly extending threaded studs or posts 33, only one of which is labeled, symmetrically spaced thereabout. The inner cylindrical rim of ring 31 is welded to metal tube 5 and is in electrical and mechanical contact with that tube. The contact ring 31 serves as another electrical connection block for one of the electrical leads from each lamp.

As shown in FIG. 1, an insulator spool 7, suitably of Vespel material, fits coaxially over tube 5 and is spaced a short distance along the tube's axis behind the back side of lamp housing 3. The spool fits closely to that shaft and seats a cylindrical metal contact block 9, coaxially overlying the spool. As later more fully described, contact block 9 serves as a common electrical connection for one of the electrical leads from each of lamps 1. Insulator spool 7 electrically insulates the contact block from the metal shaft 5, which is electrically grounded.

As best viewed in FIG. 2, contact block 9 is formed in two semi-cylindrical portions that are assembled together in a clam-shell like arrangement. As illustrated in invisible lines, the semi-cylindrical portion 9b is joined over the outer surface of the spool to the complementary portion of the contact block with the portions being axially aligned by fitting between the radially protruding end lips or rims of insulator spool 7. The two halves are fastened together by rigid wires 11 which hold the two sections together in place on the spool. Those wires are positioned in respective ones of the three axially spaced circumferential grooves formed in the outer surface of the semi-cylindrical portions, loop around and circumscribe the two semi-cylindrical halves, and have their respective ends twisted together. The contact block also includes three or more axially extending passages through the block, represented by dotted lines, for electrical leads 37, 39 and 40, later herein described. Additionally, eight threaded bolt holes are located in the block's front end for bolts 4a, symmetrically spaced about the block's periphery. The area immediately surround the bolt holes is machined flat to form a planar tab surface to better seat a connector contact ring flush with the contact block and ensure a good electrical connection.

As also shown to the right in FIG. 2, tube 5 is the outer tube in a concentric arrangement of two cylindrical tubes, each of which extends into lamp housing 3 and contains an end that opens into the internal cavities within the lamp housing, described in connection with FIG. 4 to which reference is made.

Figure 4:
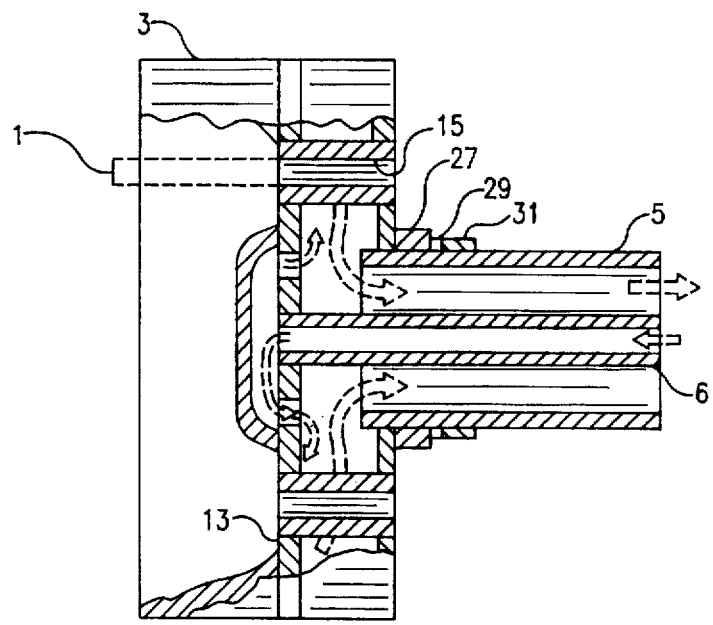
FIG. 4 is a partial section view of the lamp housing component used in the embodiment of FIG. 1.

As illustrated in the partial section view of FIG. 4, the base portion of lamp housing 3 is hollow and permits circulation of coolant fluid about the cylindrical tubes defining the mount or seat for lamps 1, one of which is generally illustrated in invisible lines. The coolant is pumped into the chamber through tube 6, which is welded in place to a spar or support within the chamber and coolant fluid exits through the annulus between tubes 5 and 6. The end of tube 5 is welded to the back wall 17 and supports the lamp housing in a cantilever like fashion. Circulation of coolant helps prevent the lamp housing from overheating and prevents thermal expansion as would distort the shape of the lamp housing. The foregoing represents one internal cooling structure for the lamp housing. As those skilled in the art appreciate, alternative shapes for the coolant chambers may also be selected.

Returning to the view of FIG. 1, the smaller diameter metal tube 6 fits coaxially within tube 5, as illustrated in the cut-away view on the lower right in the figure, and is slightly greater in length. The smaller tube serves as a coolant inlet passage for coolant introduced into the cooling cavities within the housing's interior, while the annular space between tubes 5 and 6 serves as a coolant outlet passage from the lamp housing. Fluid couplings are provided at the assembly's remote end as shown in FIG. 3, not visible in this figure.

The concentric tube assembly in turn fits coaxially within another larger diameter metal tube 8. As represented in the cross section view of the tube assembly on the lower right in FIG. 1, a pair of bearings 16, one of which is illustrated in a rotated section view, are mounted to the outer cylindrical wall of tube 5 at axially spaced locations and support tube 8 for rotation about the axis of tube 5. Each such bearing is of a structure generally represented in the figure and contains ball bearings or other bearing arrangement that contacts and supports the outer tubular wall and allows for rotation of tube 8 relative to tube 5. Further, the physical configuration of the bearing is such as to allow space between the points of bearing contact. The space permits insulated electrical leads 37, 39 and 40 to pass by or through the bearing structure and extend axially within the annular space defined between the outer wall of tube 5 and the inner tubular wall of tube 8.

The heater assembly also serves as a support for the structure that holds the target electrode and film in the vapor deposition apparatus. A short cylindrical disk shaped metal bonnet or collar 10 in FIG. 1 is supported by a clamping member 12 concentrically on the larger diameter rotatable tube 8. The bonnet contains a central circular opening of a diameter larger than the outer diameter of contact block 9, so that the collar may be axially positioned over that member and provide a clearance or separation between the two metal components and any bolt heads therein. The clearance ensures that the collar and contact block do not make electrical contact.

Clamping member 12 contains a generally cylindrical opening that is sized slightly larger than the diameter of tube 8's tubular wall. That relationship allows the clamping member to be slide along the axis of the tube under a slight pushing force for adjustment of its axial position, and produces sufficient friction between the clamping member and tube walls to maintain the clamping member in the axial position placed when any axial pushing force is removed and provide sufficient coupling to allow tube 8 to rotate the clamping member.

At least three radially spaced threaded studs 14, extend from respective ones of three radially outwardly projecting protrusions formed in clamping member 12, oriented parallel to the axis of the shaft 5. The studs extend through bolt passages through the bonnet 10 from the right side and are fastened thereto suitably by nuts on the bonnet's left and right side which hold the bonnet. The bonnet's outer diameter is slightly larger than the outer diameter of cylindrical lamp housing 3 to support a cylindrical tubular specimen support member or, as variously termed, a hood 20, that extends axially over the lamp housing, as better represented in FIG. 5, to which brief reference is made.

Figure 5:
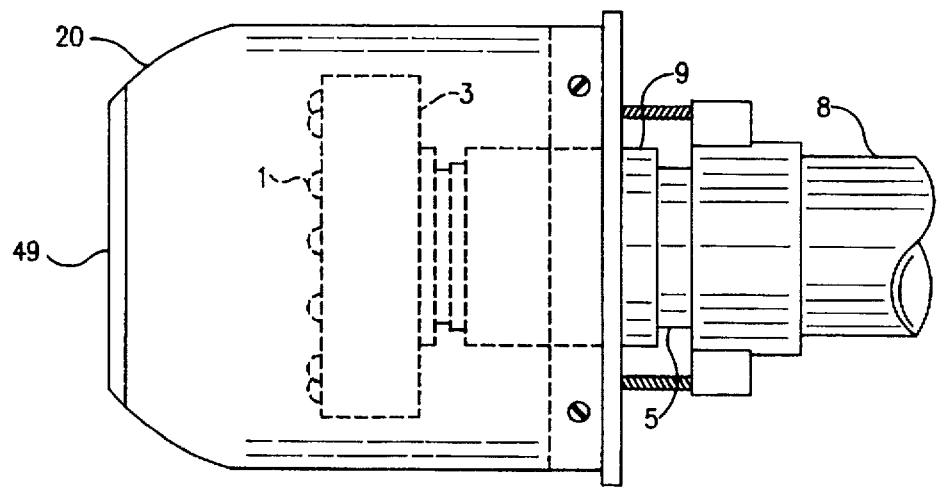
FIG. 5 illustrates a specimen support and hood combination that is mounted over the front end heater assembly of FIG. 1 prior to installation and operation within the vapor deposition apparatus.

FIG. 5 illustrates the front end of the heater assembly in side view with hood 20 in place. As shown the cylindrical right end of the hood fits about the periphery of the bonnet 10 and abutts against the bonnet's rim. Bolts, threaded into the threaded passages in the bonnet's rim, fasten the hood in place. Hood 20 supports the target electrode 49, on which the thin film is to grow, at the left end. With the foregoing structure, any rotation of tube 8 about its axis, rotates clamping member 12, bonnet 10, hood 20 and target 49, while lamp housing 3 remains stationary.

Returning to FIG. 1, lamp housing 3 also supports a temperature sensor 35, suitably a Platinum Rhodium thermocouple of conventional structure, for sensing temperature during heater operation in the vapor deposition apparatus. The thermocouple probe fits through a cylindrical shaped hollow aluminum oxide tube 37 that extends through the front and rear housing walls. Aluminum oxide, a dielectric material, electrically insulates the probe from the metal housing walls. The cable 40 attached to the thermocouple rod is routed through a passage in contact block 9, and through tube 8 to the rear of the heater assembly as better illustrated in FIGS. 2 and 3.

Continuing with FIG. 1, as purchased from the lamp manufacturer, lamp 1 contains two relatively rigid pins or, as variously termed, conductors 22 and 24 that extend from the lamp's base or bottom end. Those conductors provide an electrical current path through the lamp's glass envelope to the confined tungsten filament 26. Those conductors include a glass to metal seal of conventional structure, ensuring that the cavity within the glass envelope is isolated from the external environment and retains the confined gas.

Lamp conductors 22 and 24 are designed for insertion into a conventional lamp socket, available only for those applications intended by the lamp manufacturer. Such a socket is unavailable in the present heater assembly. Instead, a pair of small gauge flexible stranded wire leads 28 and 30, one shorter than the other are respectively attached at one end to an end of those lamp conductors 22 and 24 by means of a respective crimping insert 32 and 34. The crimping insert is formed of the metal INCONEL, a metal material which resists oxidation in a high temperature oxygen environment. Suitably, the wire is about 0.053 AWG stranded copper wire. At that diameter the wire is able to easily yield, that is, flex or give, when force is applied to an end, without transmitting any significant mechanical force to the lamp's rigid pin. Ideally, the wire should be limp in character as would prevent it from axially transmitting any force whatsoever.

The crimp insert is applied and crimped, using a crimping tool, not illustrated, to firmly mechanically press the stranded wire against the lamp's electrical lead, suitably with about 6,500 pounds force, as example, and join the two mechanically and electrically. The crimps provide a much better electrical contact between the lamp's pins and the stranded wire than can be provided by any form of lamp socket, and is recognized as an important aspect of the present invention. Thereafter, insulating sleeves 23 and 25 of fiber glass material, represented by the dotted lines, electrically insulates those leads and the associated pins from contact with the lamp housing or other adjacent metal parts by which the cable is routed. The sleeve is essentially limp in physical characteristic. Fiber glass is a material that does not break down at the high operational temperatures and pressures encountered during vapor deposition operation. Eyelet or ring connectors 36 and 38 are crimped to the end of the two wires.

When installed in the housing, the ring connector at the free end of the longer cable 23 is attached to the metal connecting block 9 and fastened down with bolt 4a, such as illustrated for the corresponding leads of other lamps in the housing in FIG. 1, thereby placing one terminal of all the lamps electrically in common with the connecting block. The ring connector at the remaining end of shorter lead 25 is connected to the second annular conductor block 31 located on the rear side of the housing member, not visible in FIG. 1, as shown in FIG. 2, and is securely fastened down with a nut.

Returning to FIG. 2, a pair of large gauge fiberglass sleeved stranded wire leads 37 and 39 are located within the annular region between tubes 5 and 8, overlying the coolant tube 5. The leads extend therein from the rear or remote end of the heater assembly, illustrated in FIG. 3, and an unsleeved or bare end length of those leads extends into a respective one of the longitudinally extending passages formed in contact block 9, represented by dotted lines in FIG. 2, to make electrical contact with the contact block.

A copper crush button or other fastening device 41 enters the block along a radius from the outer wall and presses the associated bare stranded electrical lead against the metal passage wall to ensure good electrical contact. The copper crush button is preferred, since it minimizes damage to the electrical lead and allows for easier dissassembly for maintenance service, whereas set screws can cut and/or fray the electrical leads. Further the ends of the stranded electrical leads are fused to prevent the individual filaments from spreading apart at the end, such as at the end 43 illustrated in FIG. 1. The fused end permits the respective electrical leads to be more easily inserted into the passages within the connector. Although only a single electrical lead is sufficient to handle the electrical current required to drive the quartz lamps, two leads are preferred as they divide the current and lower individual $I^2R$ resistive heat losses. For like reasons four leads is even more preferable for maximum reliability and service life.

Referring next to FIG. 3, which illustrates the rear end of the heater assembly in a simplified not-to-scale top view, the external current source is applied to connectors 37b and 39b and thereby to insulated leads 37 and 39. One terminal of the current source and the end of metal tube 5 is connected to electrical ground. The two insulated leads 37 and 39 extend through the annular space between tubes 5 and rotatable tube 8 and an uninsulated end portion of those respective leads extends into and through the passages in cylindrical contact block 9, shown in FIG. 2 to which reference is next made. From contact block 9, the current path extends to lamps 1 through each of the insulated leads 23, only one of which is illustrated in the figure, and thereby to one end of the lamp's enclosed tungsten filament. From the other end of the lamp's tungsten filament the current path extends from the associated lead 25 to the annular contact block 31, located on the back side of lamp housing 3. A like current path extends through each of the other lamps in the housing between cylindrical contact block 9 and contact block 31.

Contact block 31 is in electrical and mechanical contact with the lamp housing 3 and metal tube 5. The current path extends through metal tube 5 back to the remote end of the heater assembly, where, as earlier described, that metal tube is connected to electrical ground. Metal coolant tube 5 serves both as part of the electrical current path for the heater assembly and as part of the coolant plumbing. As elsewhere herein described, tube 5 confines a coolant fluid. Thus any $I^2R$ losses occurring due to current flow along tube 5 is also minimized and held in check by cooling, thereby further enhancing the reliability and operational life of the heater assembly.

Figure 6:
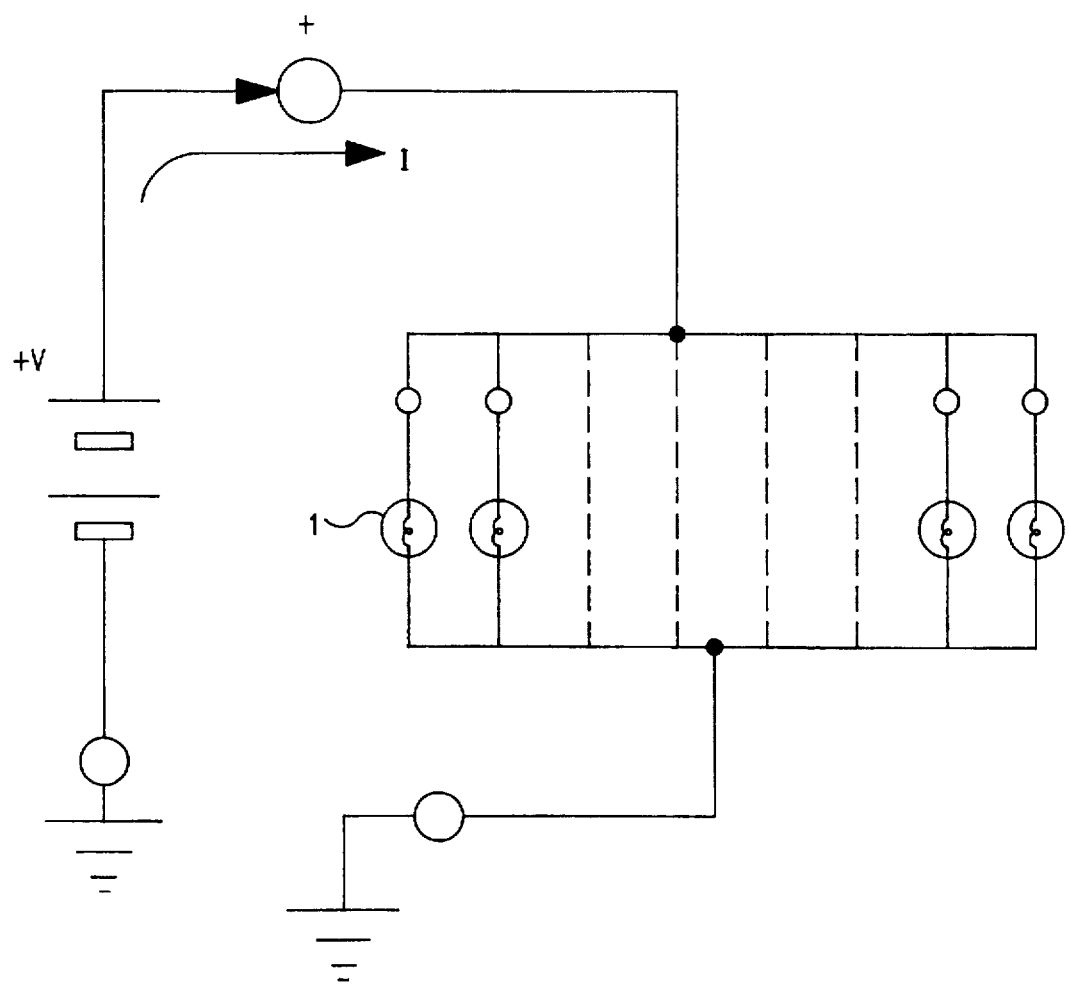
FIG. 6 is an electrical schematic of the lamp's energization circuit.

FIG. 6 schematically represents the foregoing circuit for energizing the lamps. As illustrated the lamps are connected in parallel circuit. Essentially the lamps are of identical construction and should have essentially equal resistance in circuit. With eight such resistors in parallel circuit, the resistance of the circuit overall is one-eighth that of an individual lamp. A source of grounded voltage applied to that circuit, produces current which, at least theoretically, evenly divides between the eight lamps.

Figure 7:
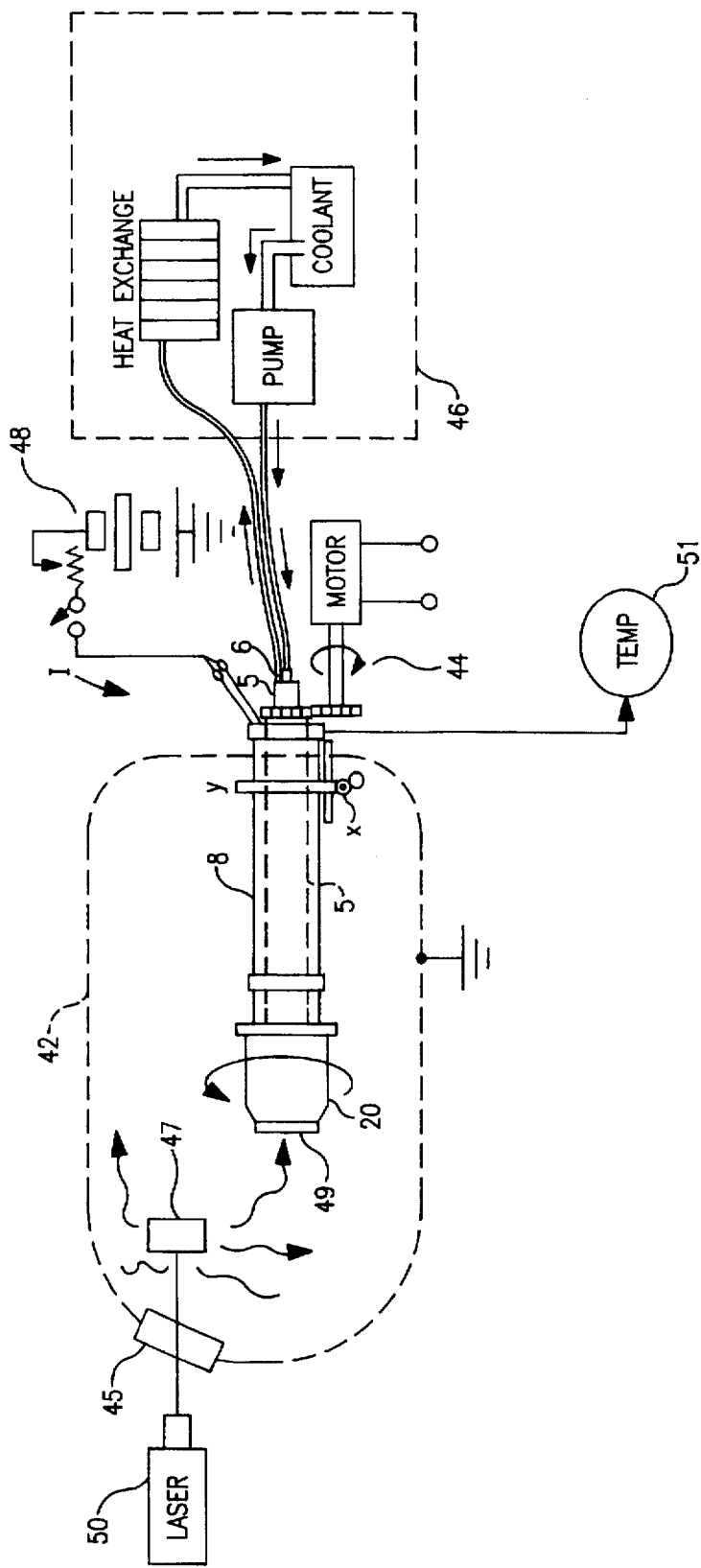
FIG. 7 symbolically illustrates a vapor deposition apparatus that employs the novel heater assembly as will aid in the understanding of the operation of the invention.

To assist in understanding the nature of the invention and its context, a simplified illustration of the vapor deposition apparatus should prove helpful. Reference is made to FIG. 7, which schematically and pictorially illustrates a vapor film deposition apparatus. The apparatus includes a vapor deposition chamber 42, which is grounded, coolant supply 46, a grounded DC electrical supply 48, drive motor assembly 44, laser 50, and temperature indicators. The heater assembly and supported elements, such as tube 8, hood 20 and target 49 are inserted into the vapor deposition apparatus's chamber 42 through an opening. More specifically, the foregoing assembly is mounted on a motor driven X-Y positioner, not illustrated, that is in turn mounted on a set of rails, also not illustrated, that allows the assembly to dock to an O-ring on the chamber.

A grounded DC electric current supply 48 is applied to leads 38 and 39, of the heater assembly, which as earlier described routes current through the lamps, which, in response, produces heat. That heat is directed to the specimen 49 and through the hood to the atmosphere within the chamber.

Cooling system 46 is connected to the coolant inlet and outlet couplings with the coolant pump connected to the inlet and the return to the heat exchanger and reservoir. The coolant cools the lamp housing assembly 3 and, indirectly, electrical leads 37 and 39. The chamber is placed in-vacuum and a limited amount of Oxygen is introduced, raising the pressure somewhat, providing an oxygen rich atmosphere, which is corrosive.

Laser 50 is operated and directs a continuous high energy coherent light beam through a window 45 into the chamber and onto a Yittrium Barium Copper Oxide source 47 and gradually vaporizes the source, creating a plasma. Source material from that plasma deposits onto the substrate specimen 49 and, over time, the deposits build up into a layer of the requisite thickness. And an electric drive motor 44 is coupled to the outer tube 8 as represented by the motor and gear train. The drive motor rotates tube 8 and hood 20 and the specimen 49 in front of the heat lamps, ensuring that the specimen is evenly heated.

During operation, temperature sensor within the chamber is monitored at display 51 to ensure the temperature is of the requisite level, suitably about 680 degrees Centigrade, using an appropriate negative feedback loop. If the temperature departs from that level, for example, drops, the supply voltage is automatically or manually increased to raise the current, and, hence, the heat generated by the lamps; if the temperature increases, the supply voltage is automatically or manually decreased and the reverse occurs, decreasing the generated heat.

The coolant that exits through tube 5 during operation, although warmed, is still much lower in temperature than the ambient environment within the vapor deposition chamber during the latter's operation. Hence, the coolant tube produces a temperature gradient within the oxygen rich atmosphere; the closer an object is positioned to tube 5, the lower its temperature. As earlier described in connection with FIG. 1, to which reference is again made, the electrical leads 37 and 39 which supply DC current to lamps 1 are positioned alongside the outer wall of tube 5, and within the rotatable tube 8, and are thus positioned within this lower temperature region. This physical positioning serves to prevent those electrical leads from overheating and melting due to $I^2R$ losses in the wire and/or in the high temperature oxygen environment.

Although those electrical leads are a heavy gauge, the electrical resistance of wire increases with temperature. Carrying the requisite lamp operating current through those leads, as the temperature of the wire is raised, the wire attains a higher electrical resistance. That higher resistance increases the $I^2R$ losses, which generates even more heat and reducing current to the lamps. By raising the voltage to restore the current to the requisite current level to drive the lamp, more heat still is generated and the resistance increases further. Without cooling, the foregoing mode could continue until the electrical leads are melted or burn up, much like a thermal fuse, interrupting the current to the lamps. By positioning those electrical leads adjacent the coolant tube, excess heat is drawn off, the leads are maintained at an appropriate resistance level, avoiding the described thermal runaway effect. That physical arrangement thus serves to enhance the reliability and operational life of the heater assembly.

In retrospect one realizes that the present invention offers no new theory in vapor deposition technique, but, instead, offers a novel structure that makes known vapor deposition technique economically practicable. At first glance the present invention may appear as a gratuitous combination of mechanical configurations of seemingly little import as might be thrown together by chance. Yet with the hindsight of this disclosure, those skilled in the vapor deposition field should readily understand the physical principles underlying the structural relationship of the elements which form this new heater assembly. In industrial practice, the invention proves of great practical worth. It is seen as a "nuts and bolts" invention that allows one to apply the great conceptualization of vapor deposition technique. which the pure theoretician rarely converts to a practicable device, to the requirements of industry and provides a practical and reliable tool.

It is believed that the foregoing description of the preferred embodiments of the invention is sufficient in detail to enable one skilled in the art to make and use the invention. However, it is expressly understood that the detail of the elements presented for the foregoing purpose is not intended to limit the scope of the invention, in as much as equivalents to those elements and other modifications thereof, all of which come within the scope of the invention, will become apparent to those skilled in the art upon reading this specification. Thus the invention is to be broadly construed within the full scope of the appended claims.

What is claimed is:

1. A heater assembly for a vapor deposition apparatus comprising:

a plurality of quartz lamps;

said lamps comprising a gas proof light transmissive envelope confining a xenon gas and a tungsten filament, and containing at least a pair of electrical conductors extending through said gas proof envelope in gas sealed relationship therewith, said conductors being connected electrically, internal of said envelope, to opposite ends of said tungsten filament;

a first elongate electrical lead, comprising a flexible stranded electrical wire;

a second elongate electrical lead, shorter than said first, comprising a flexible stranded electrical wire;

a pair of Inconel crimping sleeves;

said first Inconel crimping sleeve engaging an end of said first elongate electrical lead and an end of said lamp electrical conductor for crimping said leads together, wherein said first elongate electrical lead is pressed into direct contact with said lamp electrical lead;

said second Inconel crimping sleeve engaging an end of said second elongate electrical lead and an end of said second lamp electrical conductor for crimping said leads together, wherein said second elongate electrical lead is pressed into direct contact with said lamp electrical lead to provide an oxidizing atmosphere resistant electrical contact;

first and second fiberglass sleeves for providing electrical insulation over said respective conductors and electrical leads;

a terminal connector member on the remaining end of said first lead, and another terminal connector member on the remaining end of said second elongated electrical lead;

metal lamp support means; said lamp support means comprising a hollow cylindrical member having an axis, and a disk shaped end wall portion at a front end, said end wall portion having a radiant energy reflecting surface, and having a plurality of lamp receiving cylindrical openings through said end wall portion, said plurality being equal in number to the number of lamps in said plurality of lamps;

said openings being symmetrically positioned in said front wall portion, evenly angularly spaced about said axis at a predetermined radial distance therefrom;

first and second semi-cylindrical insert members, said cylindrical portion being of a diameter adapted to fit within and conform to the cylindrical wall of said lamp opening, and each said insert member having a flat end for engaging a portion of said lamp; said insert members being positioned on each side of said lamp envelope and within said lamp opening with the flat side of said insert member engaging said lamp envelope;

said lamp housing member having an annular metal member coaxially positioned on said rear surface;

a plurality of terminal fastening means extending from said annular member, said terminal fastening means being symmetrically positioned about said annulus; said terminals of said second electrical lead of each lamp means being fastened to a respective one of said terminal fastening means to place one terminal of each of said lamp means in common electrical circuit;

a first hollow metal shaft of diameter D1; said hollow metal shaft having an end engaging said annular metal member for supporting said lamp housing member in cantilever like fashion;

a second hollow support shaft of diameter D2, said second support shaft being located within said hollow rotatable metal shaft and coaxial therewith;

a third hollow support shaft of diameter D3, said third shaft ensleeving a portion of said first hollow metal shaft to leave an end portion of said first hollow metal shaft exposed and being oriented coaxial with said first shaft to define a annular cylindrical space between said first and third shafts;

bearing means located within said annular cylindrical space for rotatably supporting said third rotatable metal shaft on said first hollow metal shaft;

a hollow cylindrical spool-shaped electrical insulator of predetermined length, said cylindrical spool-shaped insulator being mounted on an exposed portion of said first hollow shaft;

first and second semi-cylindrical metal clam-shell members adapted to be fastened together to define a cylindrical metal member;

first fastening means for fastening said semi-cylindrical members together over said hollow cylindrical spool-shaped insulator;

second terminal fastening means for fastening each of said terminal means of said first elongate lead of each of said quartz lamps to said cylindrical metal member;

axially extending passage means through one of said clam shell members;

stranded electrical conductor means extending through said axially extending passage means in said one clam shell member, said stranded electrical conductor means extending along side said third shaft means; and thermocouple means mounted in said lamp housing member.

2. The invention as defined in claim 1 wherein said stranded electrical conductor means further includes a fused end, said fused end being positioned at an end of said axially extending passage means in said one clam shell member.

3. The invention as defined in claim 2, further comprising radially extending passage means in said one clam shell member, said radially extending passage means intersecting said axially extending passage means in said clam shell member; copper crush button disposed in said radially extending passage means and abutting a side of said stranded electrical conductor means.

4. The invention as defined in claim 3 wherein said terminal fastening means further comprises: a threaded member, said threaded member being axially extending, and a nut for fastening to said threaded member, wherein said terminal means is placed in compressed engagement between said nut and said annular member; and wherein said invention further comprises:

first coolant connector means coupled to one of said second and third shafts for introducing coolant fluid to the hollow of said third hollow metal shaft; and second coolant connector means for coupling coolant from the annular space between said second hollow support shaft and said third hollow support shaft to an external coolant fluid sink.

5. An electrical heater assembly for disposition within a high temperature oxidizing environment in a vapor film deposition apparatus to maintain a deposited film within said vapor film deposition apparatus at a temperature within the range of 650 degrees Centigrade to 900 degrees Centigrade, comprising:

a plurality of quartz lamps, each said lamps containing a glass envelope confining a gas atmosphere and a coiled Tungsten filament, and first and second elongate relatively rigid electrical contacts extending from said glass envelope;

a lamp housing assembly for holding said plurality of quartz lamps in position about a front side of said housing assembly for radiating heat from said front side of said housing assembly;

said lamp housing assembly containing a plurality of passages between said front side and said rear side, each said passage for holding a respective one of said quartz lamps with at least a major portion of said quartz lamp's glass envelope extending through said front side of said lamp housing assembly;

a first elongate hollow metal shaft; said first elongate hollow metal shaft for providing a cantilever support for said lamp housing assembly and providing an internal conduit for passage of coolant fluid;

a first hollow metal cylinder, said first hollow metal cylinder being supported upon said first elongate metal shaft and electrically insulated therefrom, said first hollow metal cylinder being oriented coaxial with said first metal shaft and surrounding a portion thereof;

a second hollow short metal cylinder, said second hollow short metal cylinder being mounted to a rear side of said lamp housing assembly oriented coaxial with said first elongate metal shaft and being in electrical contact with said first elongate metal shaft;

and wherein each of said plurality of quartz lamps includes associated therewith:

a first length of relatively flexible stranded wire;
a second length of relatively flexible stranded wire; said second length being shorter in length than said first length;

and first and second crimp inserts, each of said crimp inserts being formed of a metal material that is non-corroding by Oxygen;

said first length of wire having an end connected to said first hollow metal cylinder; and said first crimp insert mechanically and electrically connecting a remaining end of said first length of wire to a first one of said quartz lamp's elongate rigid electrical contacts;

and said second length of wire having an end connected to said second hollow metal cylinder; and said second crimp insert mechanically and electrically connecting a remaining end of said second length of wire to a second one of said quartz lamp's elongate rigid electrical contacts; whereby said quartz lamps are placed in a parallel electric circuit between said first hollow metal cylinder and said second hollow short metal cylinder;

electrical lead means extending alongside said first elongate hollow metal shaft to maintain close proximity to said internal conduit of said first elongate hollow metal shaft, whereby said electrical lead means is cooled;

said electrical lead means extending into electrical contact with said first hollow metal cylinder to complete a series electrical circuit through said first hollow metal cylinder, said parallel electrical circuit through said plurality of quartz lamps, said second hollow short metal cylinder and said first elongate hollow metal shaft.

6. The invention as defined in claim 5, wherein said metal material comprises INCONEL.

7. The invention as defined in claim 5, wherein lamp housing assembly holds said quartz lamps in a planar array with said lamps being symmetrically positioned about a center of said front side.

8. The invention as defined in claim 5, wherein said heater assembly further includes:

first fastening means for each said first length of wire for connecting said end of said first length of wire to said first hollow metal cylinder, each said first fastening means comprising:

a first connecting ring connected to said end of said first wire; said first hollow metal cylinder including a threaded bolt hole associated with said connecting ring; and bolt means extending through said first connecting ring and into said first hollow metal cylinder for holding said connecting ring in mechanical and electrical contact with said first hollow metal cylinder;

a second fastening means for each said second length of wire for connecting said end of said second length of wire to said second hollow short metal cylinder, each said second fastening means comprising:

a second connecting ring connected to said end of said second wire; said second hollow short metal cylinder containing a threaded stud; said second connecting ring extending onto said threaded stud; and nut means threaded onto said threaded stud for holding said connecting ring in mechanical and electrical contact with said second hollow short metal cylinder;

and wherein said first hollow metal cylinder includes a first axially extending passage, and wherein said electrical lead means extends into said first axially extending passage.

9. The invention as defined in claim 8, wherein each of said plurality of quartz lamps further includes associated therewith:

a first sleeve of fiberglass insulating material ensleeving said first rigid electrical contact, crimp insert, and said first length of wire; and Et second sleeve of fiberglass insulating material ensleeving said second rigid electrical contact, said crimp insert, and said second length of wire.

10. The invention as defined in claim 5, further comprising: a spool of electrical insulating material; said spool being mounted upon said first elongate hollow metal shaft; and wherein said first hollow metal cylinder seats coaxially upon said spool.

11. The invention as defined in claim 5, wherein said lamp housing assembly includes an internal cavity for circulating coolant fluid; wherein said first hollow metal shaft includes an end that opens into said internal cavity of said lamp housing assembly and, further comprising:

a second hollow metal shaft for internally providing a second coolant conduit to said lamp housing assembly, said second hollow metal shaft being mounted within said first hollow metal shaft and oriented coaxial therewith, said second hollow metal shaft having an end opening into said internal cavity of said lamp housing assembly.

12. The invention as defined in claim 11, further comprising:

a third elongate hollow metal shaft, said third hollow elongate metal shaft being mounted coaxially over a portion of said first hollow metal shaft and being axially rotatable relative to said first hollow metal shaft;

a disk shaped metal member containing a central circular shaped opening;

clamping means, said clamping means being supported on said third elongate metal shaft for supporting said disk shaped metal member coaxial with said first hollow metal shaft in a position with said central circular opening overlying said first hollow metal cylinder, and said disk shaped metal member being in spaced relation to said first hollow metal shaft.

13. The invention as defined in claim 12, further comprising:

Bearing means;

said bearing means being supported by said first hollow metal shaft for mounting said third hollow metal shaft for rotation about axial rotation.

14. The invention as defined in claim 13, wherein said lamp housing assembly further comprises a cylindrical exterior surface.

15. The invention as defined in claim 14, further comprising:

first fluid coupling means for coupling coolant fluid into said second hollow metal shaft;

second fluid coupling means for expressing coolant fluid from said first hollow metal shaft;

means for connecting a DC current source to said electrical lead means; and means for connecting said first hollow metal shaft to electrical ground.

* * * * *